US009501067B2

(12) United States Patent
Vega et al.

(10) Patent No.: US 9,501,067 B2
(45) Date of Patent: Nov. 22, 2016

(54) FLUID PRESSURE REGULATION SYSTEM FOR FLUID-DISPENSING SYSTEMS

(71) Applicant: GPD Global, Inc., Grand Junction, CO (US)

(72) Inventors: Christian R. Vega, Grand Junction, CO (US); John W. Kohler, Grand Junction, CO (US); Alvin R. Miller, Grand Junction, CO (US)

(73) Assignee: GPD Global, Inc., Grand Junction, CO (US)

(*) Notice: Subject to any disclaimer, the term of this patent is extended or adjusted under 35 U.S.C. 154(b) by 0 days.

(21) Appl. No.: 14/480,961

(22) Filed: Sep. 9, 2014

(65) Prior Publication Data

US 2015/0075635 A1    Mar. 19, 2015

Related U.S. Application Data

(60) Provisional application No. 61/879,733, filed on Sep. 19, 2013.

(51) Int. Cl.
*B67D 1/00* (2006.01)
*G05D 16/20* (2006.01)
*B05C 11/10* (2006.01)

(52) U.S. Cl.
CPC ....... *G05D 16/2013* (2013.01); *B05C 11/1013* (2013.01); *H05K 2203/0126* (2013.01); *Y10T 137/0396* (2015.04); *Y10T 137/86002* (2015.04)

(58) Field of Classification Search
CPC . G05D 16/2013; B05C 5/00; B05C 11/1013; Y10T 137/0396

USPC .............. 222/61, 63, 52, 55; 901/43, 41, 30
See application file for complete search history.

(56) References Cited

U.S. PATENT DOCUMENTS

| | | | |
|---|---|---|---|
| 5,199,607 A * | 4/1993 | Shimano | B67D 7/72 222/55 |
| 5,277,333 A | 1/1994 | Shimano | |
| 6,152,348 A | 11/2000 | Finn et al. | |
| 6,334,569 B1 | 1/2002 | Yoshimura | |
| 6,386,433 B1 | 5/2002 | Razon et al. | |
| 6,634,545 B2 | 10/2003 | Razon et al. | |
| 6,715,506 B1 | 4/2004 | Ikushima | |
| 7,121,449 B2 | 10/2006 | Zakel et al. | |
| 7,654,414 B2 * | 2/2010 | Hiranaga | B67D 1/10 222/52 |

(Continued)

OTHER PUBLICATIONS

PCT International Search Report with attached Written Opinion of the International Searching Authority for International Application No. PCT/US2014/055908, dated Dec. 22, 2014, 7 pages.

*Primary Examiner* — Lien Ngo
(74) *Attorney, Agent, or Firm* — Dorr, Carson & Birney PC

(57) ABSTRACT

A system actively regulates the fluid pressure entering the pump of a fluid-dispensing system to provide a more uniform fluid flow exiting the pump. The pump is supplied with fluid from a pressurized reservoir (e.g., that is pressurized from an external air source, or by mechanical or electrically-driven pressurization). A pressure sensor monitors the fluid pressure in the fluid supply line between the reservoir and pump. A controller receives this fluid pressure reading as an input to regulate the pressurization of the reservoir. Optionally, a second pressure sensor can be used to monitor the fluid pressure at the pump exit to provide an additional input for the controller.

13 Claims, 2 Drawing Sheets

(56) References Cited

U.S. PATENT DOCUMENTS

| | | |
|---|---|---|
| 7,810,705 B2 | 10/2010 | Mizuno et al. |
| 7,967,168 B2 * | 6/2011 | Geier .................. G05D 7/0676 222/1 |
| RE43,288 E * | 4/2012 | Sund .................... G01F 1/8413 137/209 |
| 2007/0090132 A1 | 4/2007 | Williams et al. |
| 2007/0215639 A1 | 9/2007 | Roberts et al. |
| 2008/0107796 A1 * | 5/2008 | Cho .................... B05C 11/1013 427/8 |
| 2009/0014468 A1 * | 1/2009 | Byers .................... B05B 12/085 222/61 |

* cited by examiner

FLUID PRESSURE REGULATION SYSTEM FOR FLUID-DISPENSING SYSTEMS

RELATED APPLICATION

The present application is based on and claims priority to the Applicants' U.S. Provisional Patent Application 61/879,733, entitled "Pressure Regulating System for Fluid Dispensing Systems," filed on Sep. 19, 2013.

BACKGROUND OF THE INVENTION

Field of the Invention

The present invention relates generally to the field of fluid-dispensing systems, primarily in the electronics industry. More specifically, the present invention discloses a system for regulating the pressure of the fluid supplied to the pump in a fluid-dispensing system.

Statement of the Problem

Fluid-dispensing systems are widely used in the electronics industry to dispense small quantities of viscous fluids, such as underfill, soldering paste, encapsulants, adhesives or similar fluids. For example, these fluid-dispensing systems are typically used to dispense a predetermined pattern of dots, lines or area fills of fluid on printed circuit boards or other substrates, pallets or products that are presented to the dispensing system. The tolerances required in this field can be quite demanding regarding both the location and quantity in terms of weight and volume of fluid dispensed on the printed circuit board, substrate, pallet or other products that are presented to the system.

Conventional fluid-dispensing systems in the electronics industry typically include an electrically-controlled pump that is triggered by a controller to dispense a predetermined pattern of dots or lines of fluid through a dispenser tip or nozzle over time as it moves relative to a circuit board, to thereby create the desired spatial pattern of fluid on the surface of the circuit board, substrate or other product.

The pump is supplied with fluid from a reservoir. Due primarily to the viscosity of some fluids commonly used in the electronics industry, the reservoir is sometimes pressured with air or by a mechanical or electrical device to help maintain a uniform flow of fluid into the pump. The pressurization of the reservoir to feed fluid into the pump is generally determined by the characteristics of the pump and the rate at which fluid is dispensed from the pump onto the circuit board for a particular job.

The conventional approach in the electronics industry has been to perform an initial setup for each job with trial runs to verify that the fluid-dispensing machine is properly functioning and that a satisfactory fluid pattern is being dispensed. But, this ignores variations in the fluid flow rate from the reservoir due to changes in the level of fluid in the reservoir, stiction of the plunger or stopper in the syringe, as well as fluctuations in air pressure that may occur over the course of a job. In particular, changes in the pressure at which fluid is fed into the pump can result in variations in the fluid output of the pump. As a result, there is a need for a system to actively regulate fluid pressure into the pump on a continuous basis during operation of the fluid-dispensing system to help ensure consistent performance.

Solution to the Problem

The present invention addresses this problem in the prior art by providing a means for actively regulating the fluid pressure into the pump. This is accomplished by a feedback controller that monitors the fluid pressure in the supply line (which may be located between the reservoir and pump, or directly at the pump inlet, or directly at the reservoir exit), and accordingly adjusts the pressurization of the reservoir to maintain a desired fluid pressure entering the pump. Optionally, a second pressure sensor can be used to monitor the fluid pressure at the pump exit to provide an additional input for the feedback controller.

SUMMARY OF THE INVENTION

This invention provides a system for modulating and regulating the fluid pressure into the pump of a fluid-dispensing system. The pump is supplied with fluid from a pressurized reservoir (e.g., that is pressurized from an external air source, or by a mechanical or electrically-driven *** force). A pressure sensor monitors the fluid pressure in the fluid supply line between the reservoir and pump. A feedback controller receives this fluid pressure reading as an input to regulate the pressurization of the reservoir.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
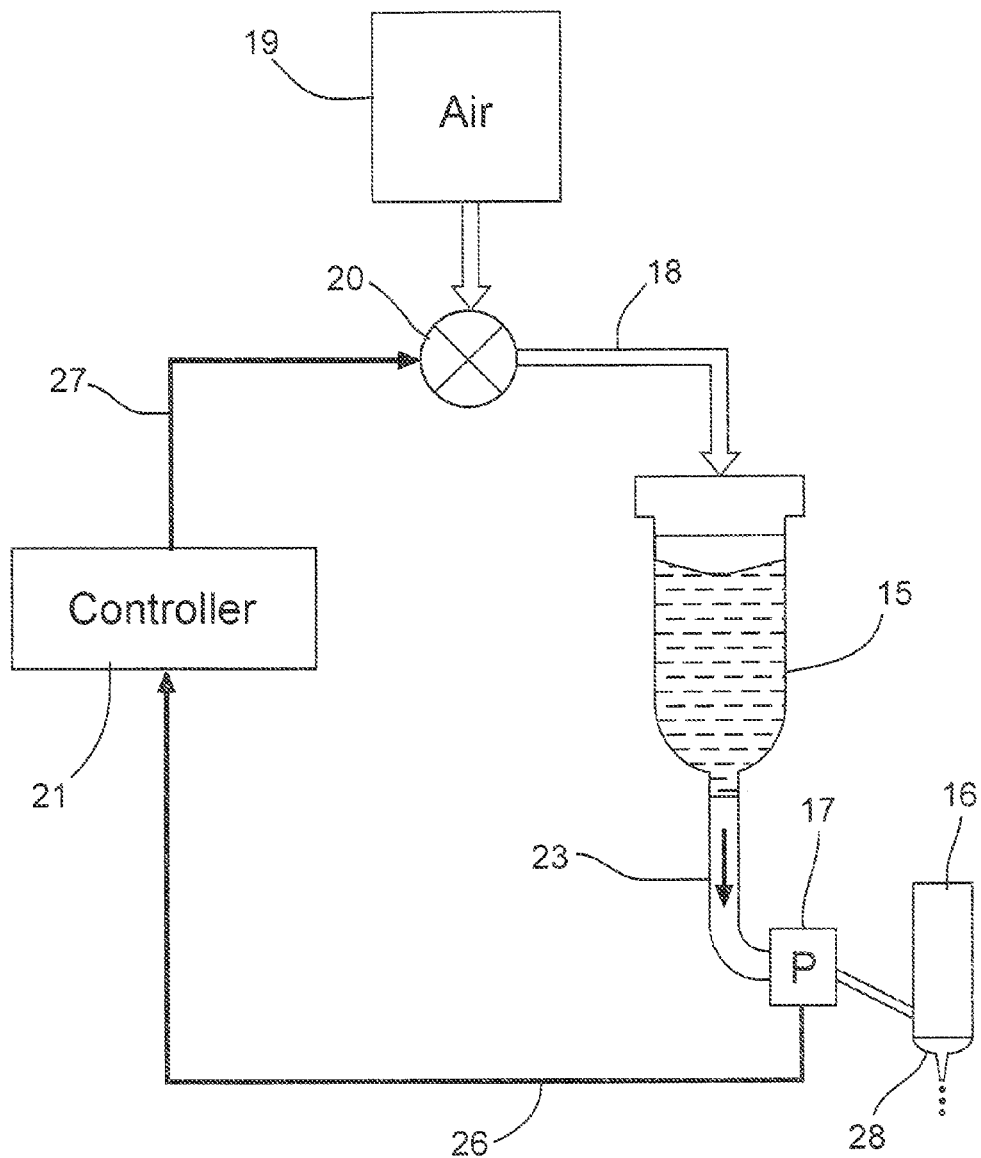
FIG. 1 is a block diagram of an embodiment of the present invention.

Turning to FIG. 1, a block diagram is provided showing an embodiment of the present invention. A conventional pump or fluid-dispensing device 16 is used to dispense a viscous fluid (e.g., underfill, solder paste, encapsulant, adhesive or similar fluid) onto a circuit board, substrate or other product beneath. For example, the pump 16 can be an auger pump or jetting valve or other pneumatically or electronically-controlled pump or valve, in which the dispensing mechanism is dependent on fluid presented to the inlet of the dispensing device. Other types of dispensing mechanisms, such as a time-pressure system could be employed.

A reservoir 15 stores a quantity of this fluid and supplies it to the pump 16 via a fluid supply line 23. For example, the reservoir can be a syringe, cartridge or a larger container. In the embodiment depicted in FIG. 1, the reservoir 15 is pressured by an external air supply 19 (e.g., an air compressor) connected by a regulated air supply line 18 to assist in delivering fluid from the reservoir 15 to the inlet of the pump 16. Alternatively, the reservoir can be pressurized by other mechanical means (e.g., a syringe mechanism or hydraulic pressure) or electrical means which may be a motor or other electrical motion device.

The present invention employs a pressure sensor 17 to detect the fluid pressure in the fluid supply line 23 between the reservoir 15 and the inlet to the pump 16. Ideally, the measured pressure at the pressure sensor 17 accurately reflects the fluid pressure at or near the inlet to the pump 16. Nonetheless, depending on fluid viscosity and the location of the pressure sensor 17 along the length of the fluid supply line 23, the measured pressure should at least serve as a suitable proxy for the fluid pressure at the inlet to the pump 16 for the purpose of regulating the air pressure supplied to the reservoir 15. It should also be noted that detecting changes in fluid pressure may be sufficient for this purpose, rather than requiring an accurate measurement of the fluid pressure itself.

A controller 21 receives these pressure readings 26 from the pressure sensor 17 either in digital or analog format. In the embodiment shown in FIG. 1, the controller 21 is configured as a feedback controller with the pressure sensor signal 26 as the feedback signal. The output of the controller 21 is a control signal 27 (i.e., a control voltage) applied to a pressure regulator valve 20 in the air pressure line leading from the air supply 19 to the reservoir 15, as shown in FIG. 1. This feedback arrangement (including the pressure sensor 17, controller 21, and pressure regulator valve 20) effectively regulates the air pressure supplied to the reservoir 15 in response to the fluid pressure measured by the pressure sensor 17 to maintain a predetermined fluid pressure in the fluid supply line, and thereby help maintain a more constant input fluid pressure to the pump 16. In turn, this helps to maintain more uniform properties of the fluid pattern dispensed by the pump (e.g., in terms of first dispense, drop size, line width and volumetric and weight repeatability). Alternatively, if the reservoir 15 is pressurized by other means, the controller 21 can be used to modulate and regulated the pressure applied to the reservoir 15.

It should be understood that a variety of different types of controllers could be employed. Also, any of a wide variety of control algorithms can be used by the controller 21. For example, the controller can be configured to regulate the air pressure to maintain a predetermined set point in the measured fluid pressure. This can be done either with, or without a dead band around the desired set point to avoid over-regulation of the air pressure to the reservoir 15. If the measured fluid pressure falls below a predetermined lower limit, the controller 21 adjusts the air supply pressure upward. If the measure fluid pressure rises above a predetermined upper limit, the controller 21 adjusts the air supply pressure downward. A proportional, integral, differential (PID) control algorithm could also be employed to regulate the air supply pressure using the fluid pressure as the feedback signal.

Figure 2:
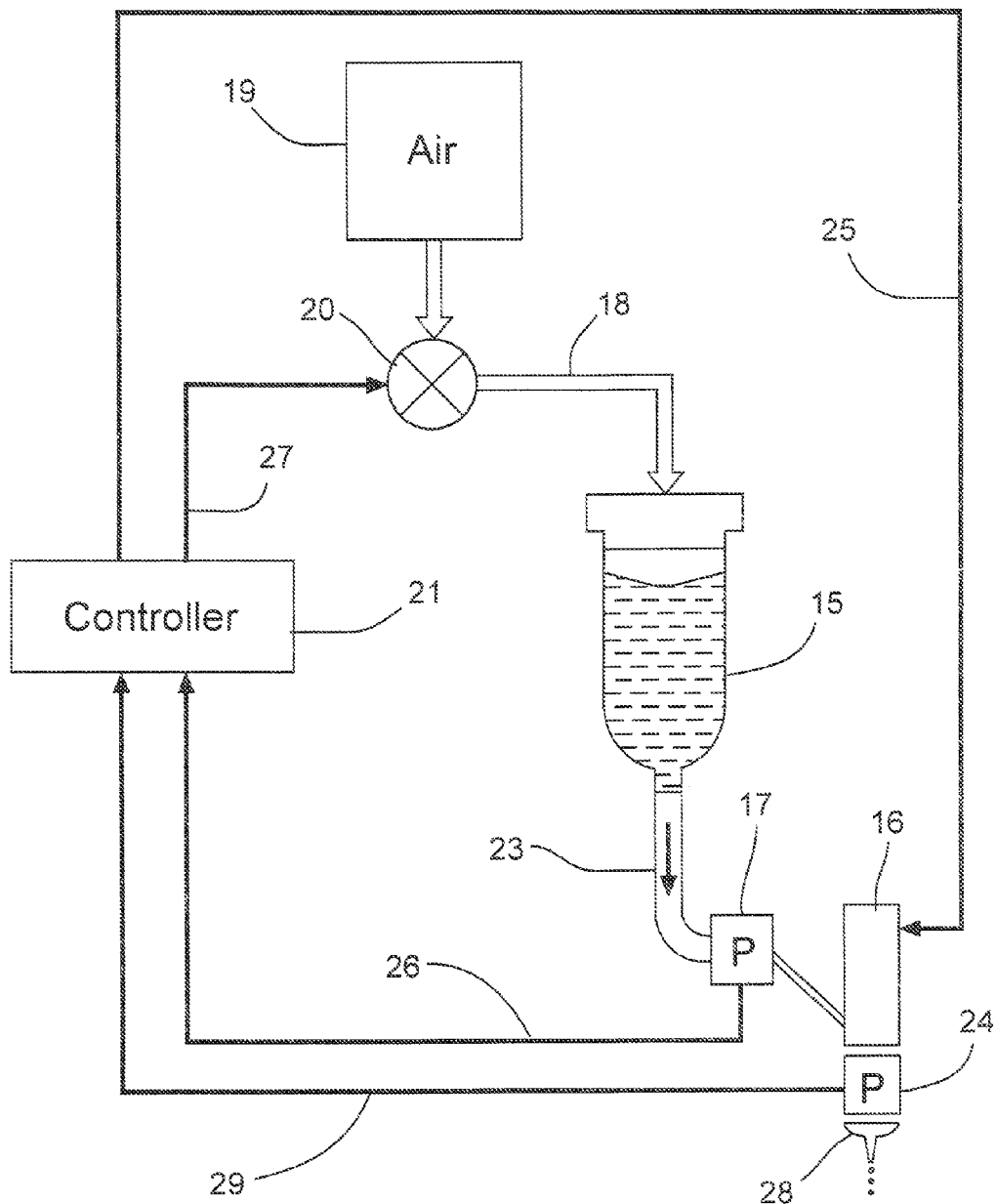
FIG. 2 is a block diagram of a second embodiment of the present invention that includes a second pressure sensor 24 to monitor pressure at the outlet of the pump 16.

FIG. 2 is a block diagram of a second embodiment of the present invention that includes a second pressure sensor 24 to monitor pressure at the outlet of the pump 16 and above the dispenser tip or nozzle 28. This pressure reading is delivered as a second feedback signal 29 as an input to the controller 21. The controller 21 can employ a predetermined combination of the feedback signals 26, 29 as inputs to regulate the air pressure to the reservoir 15, as previously discussed. The controller can also use these feedback signals 26, 29 as inputs to generate a control signal 25 to directly regulate operation of the pump 16 to maintain a set pressure at the outlet of the pump 16.

The above disclosure sets forth a number of embodiments of the present invention described in detail with respect to the accompanying drawings. Those skilled in this art will appreciate that various changes, modifications, other structural arrangements, and other embodiments could be practiced under the teachings of the present invention without departing from the scope of this invention as set forth in the following claims.

We claim:

1. A fluid pressure regulation system for fluid-dispensing systems comprising:
    a pump dispensing a viscous fluid at an outlet through a dispenser tip;
    a reservoir supplying fluid to the pump via a fluid supply line;
    means for pressurizing the reservoir to thereby set the fluid pressure supplied by the supply line to the pump;
    a pressure sensor detecting the fluid pressure in the fluid supply line; and
    a controller monitoring the fluid pressure in the fluid supply line detected by the pressure sensor and regulating the means for pressuring the reservoir to maintain a predetermined fluid pressure in the fluid supply line supplied to the pump.

2. The system of claim 1 wherein the reservoir is pressurized by an air source with a pressure regulator valve controlled by the controller.

3. The system of claim 1 wherein the reservoir is pressurized by a syringe mechanism.

4. The system of claim 1 wherein the reservoir is pressurized by hydraulic pressure.

5. The system of claim 1 further comprising a second pressure sensor detecting the fluid pressure at the outlet of the pump at the dispenser tip to provide an additional input signal for the controller.

6. The system of claim 5 wherein the controller further regulates operation of the pump in response to both pressure sensors.

7. A fluid pressure regulation system for fluid-dispensing systems comprising:
    a pump dispensing a viscous fluid at an outlet through a dispenser tip;
    a reservoir supplying fluid to the pump via a fluid supply line;
    means for pressurizing the reservoir to thereby set the fluid pressure supplied by the supply line to the pump;
    a first pressure sensor detecting the fluid pressure in the fluid supply line;
    a second pressure sensor detecting the fluid pressure at the outlet of the pump at the dispenser tip; and
    a controller monitoring the fluid pressures detected by the pressure sensors, regulating the means for pressuring the reservoir to maintain a predetermined fluid pressure in the fluid supply line supplied to the pump, and regulating operation of the pump to maintain a predetermined fluid pressure at the outlet.

8. The system of claim 7 wherein the reservoir is pressurized by an air source with a pressure regulator valve controlled by the controller.

9. The system of claim 7 wherein the reservoir is pressurized by a syringe mechanism.

10. The system of claim 7 wherein the reservoir is pressurized by hydraulic pressure.

11. A method for regulating a fluid-dispensing system having a pump dispensing a viscous fluid at an outlet through a dispenser tip, said viscous fluid supplied from a reservoir via a fluid supply line, said method comprising;
    pressurizing the reservoir to thereby set the fluid pressure supplied by the supply line to the pump;
    sensing the fluid pressure in the fluid supply line; and
    regulating the pressure in the reservoir based on the fluid pressure in the fluid supply line to maintain a predetermined fluid pressure in the fluid supply line supplied to the pump.

12. The method of claim 11 further comprising:
    sensing the fluid pressure at the outlet of the pump at the dispenser tip; and regulating the pressure in the reservoir based on the fluid pressure in the fluid supply line and the fluid pressure at the outlet of the pump at the dispenser tip.

13. The method of claim 12 further comprising regulating operation of the pump based on the fluid pressure in the fluid supply line and the fluid pressure at the outlet of the pump to maintain a predetermined fluid pressure at the outlet.

* * * * *